United States Patent
Iaia

(10) Patent No.: US 10,718,836 B2
(45) Date of Patent: Jul. 21, 2020

(54) METHOD AND DEVICE FOR COMPENSATING FOR MAGNETIC NOISE FIELDS IN SPATIAL VOLUMES, AND NUCLEAR MAGNETIC RESONANCE IMAGING APPARATUS

(71) Applicant: ESAOTE SpA, Genoa (IT)

(72) Inventor: Paolo Iaia, Genoa (IT)

(73) Assignee: ESAOTE SPA, Genoa (IT)

( * ) Notice: Subject to any disclaimer, the term of this patent is extended or adjusted under 35 U.S.C. 154(b) by 322 days.

(21) Appl. No.: 15/631,415

(22) Filed: Jun. 23, 2017

(65) Prior Publication Data

US 2018/0031651 A1  Feb. 1, 2018

(30) Foreign Application Priority Data

Jul. 26, 2016  (EP) .................................. 16181152

(51) Int. Cl.
*G01R 33/3875* (2006.01)
*G01R 33/389* (2006.01)
*G01R 33/025* (2006.01)
*G01R 33/565* (2006.01)
*G01R 33/00* (2006.01)
(Continued)

(52) U.S. Cl.
CPC ..... *G01R 33/3875* (2013.01); *G01R 33/0017* (2013.01); *G01R 33/025* (2013.01); *G01R 33/389* (2013.01); *G01R 33/543* (2013.01); *G01R 33/5659* (2013.01); *G01R 33/56563* (2013.01); *G01R 33/422* (2013.01)

(58) Field of Classification Search
CPC ............. G01R 33/3875; G01R 33/389; G01R 33/025; G01R 33/56563; G01R 33/5659; G01R 33/0017; G01R 33/543; G01R 33/422

See application file for complete search history.

(56) References Cited

U.S. PATENT DOCUMENTS 5,952,734 A  9/1999  Gelbien
6,844,732 B2 *  1/2005  Carlini ................. G01R 33/389
                                                                324/318
(Continued)

FOREIGN PATENT DOCUMENTS

EP  1 353 192 A2  10/2003
JP  H06 181903 A  7/1994

OTHER PUBLICATIONS

Extended European Search Report dated Feb. 24, 2017, issued by the European Patent Office in the corresponding European Patent Application No. 16181152.6-1568. (16 pages).

*Primary Examiner* — Dixomara Vargas
(74) *Attorney, Agent, or Firm* — Buchanan Ingersoll & Rooney PC

(57) ABSTRACT

A method for compensating magnetic noise in a spatial volume in which two concurrently operating compensation loops are provided comprising:

a closed compensation loop for magnetic noise fields outside the spatial volume and inside the electromagnetically environment;

an open compensation loop for magnetic noise fields in the spatial volume;

said two compensation loops generating each one a magnetic noise compensation field;

said two compensation fields concurrently provide for compensation of the magnetic noise field in the spatial volume.

19 Claims, 9 Drawing Sheets

(51) Int. Cl.
 *G01R 33/54* (2006.01)
 *G01R 33/422* (2006.01)

(56) References Cited

U.S. PATENT DOCUMENTS

| | | | |
|---|---|---|---|
| 7,504,825 B2 * | 3/2009 | Pittaluga | G01R 33/389 324/318 |
| 7,525,314 B1 | 4/2009 | Heiland | |
| 2003/0214296 A1 * | 11/2003 | Carlini | G01R 33/389 324/309 |
| 2006/0038562 A1 * | 2/2006 | Pittaluga | G01R 33/389 324/307 |

* cited by examiner

METHOD AND DEVICE FOR COMPENSATING FOR MAGNETIC NOISE FIELDS IN SPATIAL VOLUMES, AND NUCLEAR MAGNETIC RESONANCE IMAGING APPARATUS

BACKGROUND

The invention relates to a method for compensating for magnetic noise fields in spatial a volume, comprising the following steps:

determining characteristic data or parameters describing a magnetic noise field outside said spatial volume;

defining, on a theoretical basis, i.e. according to the laws of electromagnetism, or on an empirical basis, the correlation between the noise field outside the spatial volume and a corresponding noise field inside said spatial volume, or calculating the noise field inside the spatial volume, from the measurement/s of the magnetic field outside the spatial volume;

from the inside magnetic field, as determined theoretically or empirically, generating a magnetic compensation field, particularly for neutralizing the noise field in said spatial volume.

In the following description and claims, "noise fields" shall be intended as magnetic field fluctuations induced in a spatial volume, particularly the imaging cavity of Magnetic Resonance imaging apparatuses, which fluctuations are caused by magnetic fields outside said spatial volume or the imaging cavity of the MRI apparatus.

The term characteristic parameters describing a magnetic noise field refer primarily to the strength of the magnetic noise field and may also include the direction of the magnetic noise field which can be measured by a three axial magnetometer or similar instruments.

Currently, the wide use of electric power causes the generation of considerable magnetic fields, which pervade the environment. These magnetic fields may have considerable strengths and affect or alter the operation of electric or electronic equipment which use magnetic fields. Such equipment may be of any type, e.g. measuring instruments, diagnostic or therapeutic imaging apparatuses, and the like.

Currently, the above noise may be caused by two types of magnetic fields, which are differentiated on the basis of frequency and of the amplitude of strength of the magnetic field. A first so-called low-frequency type includes magnetic fields with frequencies ranging from less than 1 Hz to a few units of Hz. These types of low-frequency noise fields are typically generated by the passage of vehicles or the like. Each vehicle generates, in first approximation, a magnetic dipole with a predetermined strength and a predetermined position and the dipoles are oriented in the direction of the earth's magnetic field flow lines.

A second type includes noise fields generated by sources of mains AC, which have frequencies of about 50 to 60 Hz. Besides home or static sources, electric vehicles shall be also considered, such as trains, tramcars, subway trains, trolley-buses, etc., due to the considerable powers absorbed and the strengths of the fields generated thereby.

A third category might include noise fields with frequencies of the order of a fraction of the mains frequency, i.e. of about 10 to 20 Hz. Particularly, some railway electrification lines use, for instance, one-third of the mains frequency, that is a frequency of the order of 16 Hz.

Other noise fields consist of fast, i.e. high-frequency transients. In spatial volumes containing significant electrically conductive masses, e.g. shielding magnetic structures or Faraday cages, these fast transient fluctuations of the magnetic noise field induce noise currents, which modify the noise fields inside the imaging cavity. These fast magnetic field transients may be also combined with other noise types.

Currently, the methods of compensation for magnetic fields like the ones described hereinbefore use one or more sensors for determining the magnetic field amplitude and frequency.

The noise field inside the spatial volume is compensated by generating an inverse magnetic field to the magnetic noise field inside the spatial volume.

This is actuated by providing a magnetic field compensator generating the compensation magnetic field inside the spatial volume.

Methods and systems for compensating magnetic noise fields in spatial volume, and particularly in the gantry of an MRI apparatus are known from document EP1353192B1 and from document U.S. Pat. No. 7,504,825 assigned to the same applicant of the present application.

In this document, a compensation method for the magnetic noise inside the spatial volume, for example the gantry of the MRI apparatus is determined according to a transfer function of the magnetic noise field measured outside said spatial volume and by generating a magnetic compensation field which compensates the magnetic noise field determined according to said transfer function.

In said prior art solution, the system for carrying out the compensation method is an active open loop compensation.

The system for carrying out the magnetic compensation comprises a magnetic compensation field, generator which generates a magnetic compensation field permeating limited to the spatial volume, for example a magnetic compensation field generator which is housed within the magnetic structure of an MRI scanner.

FIG. 1 illustrates a block diagram illustrating the system according to the prior art according to an embodiment in which said system is applied to an MRI apparatrus.

Generally, MRI apparatus are housed inside a Faraday cage 110 for shielding electromagnetic noise.

A magnet structure which is summarized as a box 150 and generally comprising a static magnetic field generator in a spatial volume, gradient coils for generating gradient magnetic fields inside said spatial volume, RF-coils for generating RF excitation signals of the nuclear spins due to the physical capacity of atomic nuclei of absorbing and re-emitting electromagnetic radiation, RF-antenna for collecting the RF signals emitted by the transition of the nuclear magnetic spins from the excited condition in which the nuclei has absorbed electromagnetic energy into the relaxed condition in which the nuclei has re-emitted the absorbed electromagnetic energy.

Different kinds of static magnetic field generators are known which are principally:

Superconductive magnets in which a superconductive coil is energized to produce the static magnetic field, Resistive magnetic field generators, in which electric conductive coils are energized to generate a magnetic field, and Permanent magnets in which permanently magnetized material is used to generate the static magnetic field. Magnets combining said different technologies are also provided.

A generic structure of an MRI apparatus further comprises:

a magnet driving and control section which is responsible for driving the resistive or superconductive magnets such that a certain static magnetic field is generated or which controls the temperature of the magnetized material in case of permanent magnets;

a compensation magnetic field generator and a compensation magnetic field controller for driving said compensation magnetic field generator in such a way as to compensate magnetic noise fields;

a gradient coils driving unit which provides driving of the gradient coils in a synchronized way with the generation and transmission of the RF-excitation signals;

a RF generation unit for generating the RF excitation signals to be transmitted by the RF excitation coils to the target region of a body under examination and which region is coincident or contained inside a spatial volume, i.e. an imaging volume permeated by the static magnetic field and the gradient magnetic fields;

a processing unit of the RF signals acquired by the RF antenna for transforming said RF signals in image data;

a display control unit for processing the image data in order to display these data according to different display modes on a display monitor.

The static magnetic field provides for the orientation of the magnetic nuclear spins along a uniform direction which is parallel to the direction of the static magnetic field. A high spatial homogeneity of the static magnetic field is necessary in order that the RF data can be processed to image data reproducing the internal structure of a target region being examined without introducing artifacts.

Magnetic noise fields which permeates the spatial volume 160 add to the static magnetic field compromising the homogeneity of the static magnetic field.

As illustrated by FIG. 1 the magnetic noise fields 100 penetrate through the Fraday cage 110 and permeate into the spatial volume 160, in which they add to the static magnetic field B0.

A magnetic compensation field is applied by a magnetic compensation field generator 170 provided inside the magnetic structure 150. This magnetic compensation field generator is in the form of one or more resistive coils which are combined or simply overlaid to the static magnetic field generator magnets and to the gradient magnets and to the other units provided in combination therewith.

The magnetic compensation field generator 170 is driven by a driving and control chain which comprises a magnetic noise field sensing module 120, a compensation field control module 130 which processes the output signals of the magnetic noise field sensing module 120 and which compensation field control module 130 generates driving signals of a power module 140. This power module 140 generates power driving signals of the magnetic field compensation generator 170 according to the control signals of the control module 130. The control module 130 drives the power module 140 so that a magnetic compensation field is generated and superimposed to the static magnetic field and to the noise field inside the spatial volume such that the magnetic noise field is compensated in such a way that the remaining noise field inside the spatial volume 160 approaches to zero.

The method according to said prior art method and system has limitations in effectively compensating all kinds of noises.

The compensator according to the prior art is not able to effectively manage the contemporaneity of on one hand rapid disturbances and on the other hand periodic disturbances (16, 66, 50 to 60 Hz) or, in the case of periodic interferences, also the amplitude modulations of these periodic interferences.

Furthermore, due to the fact that the compensation magnetic field generating coils have limitation in the homogeneity of the field generated by them when the intensity of the magnetic field to be compensated is relatively high, the method and system according to the prior art do not manage noise on the magnet which is higher than 10 mGpp.

FIG. 2 shows a Magnetic Resonance imaging apparatus which integrates an open loop magnetic noise field compensator device according to the invention.

In this case, the spatial volume wherein the noise fields which are to be compensated for coincide with the cavity of the Magnetic Resonance imaging apparatus which is to accommodate the patient body or a part thereof and is indicated as V.

FIG. 2 describes an embodiment which includes at least one probe S1 and allows the use of multiple probes as shown by the probes S2, S3, S4, S5 and S6, which are shown by dashed and dotted lines.

A dashed line and the numeral 200 denote the control and processing electronics of a Magnetic Resonance imaging apparatus, whereas the blocks included therein are additional functional units, or have functions accomplished by appropriately programmed or controlled units of the Magnetic Resonance imaging apparatus.

These control and processing electronics drive the magnetic structure of the MRI system comprising a magnet 210 for generating a static magnetic field B0 within a cavity at least partially delimited by the magnet and within an imaging volume V in said cavity.

The Magnetic Resonance imaging apparatus includes static magnetic field B0 generators, which are denoted with numeral 211.

These static magnetic field generators can be superconductive coils, resistive coils permanent magnets, or combinations thereof.

In an embodiment of the present invention for simplicity the static magnetic field generator comprises two opposite magnetic poles enclosing a cavity for accommodating the body under examination, or a part thereof.

Control electronics of the static magnetic field generator are not illustrated in detail since it is part of the common general knowledge of the skilled person.

Furthermore, the magnet structure of the MRI apparatus comprises at least one magnetic noise field compensation coil 212 for generating inside the cavity and the imaging volume V a magnetic noise compensation field which neutralizes at least partially the effect of the magnetic noise fields on the static magnetic field B0.

The system further comprises at least one exciting pulse transmission coil 213 for transmitting to the body under examination one or more sequences of RF pulses for NMR excitation which coil is controlled by a RF excitation pulse generator 201.

The magnet structure comprises magnetic gradient fields generating coils 214 for generating during scanning, a magnetic field with a predetermined variation along each of three spatial directions (x, y, z) having the function of univocally encoding the nuclear spins and thus allowing to relate the NMR signal contributions of the RF signals received by the RF antenna 215 to a position in space for reconstructing an image. The magnetic gradient fields generating coils 214 are driven by a gradient field coils driving unit 202.

The RF NMR signals are processed by a processing unit converting the RF data into image data indicated by 204 and to an image generation unit 205. The reconstructed images can be displayed on a display 220 or stored in memories 230 which can be alternatively or in combination internal memories of the MRI apparatus or memories residing in an external storage servers or in cloud servers. Optionally the images can be stored in portable memory devices 240 such as CD rom, DVD rom CD RAM, DVD RAM, memory sticks, portable hard disks, or similar devices.

A user interface 209 providing alternatively or in combination different user input devices is provided. The user interface may be alternatively or in combination a graphical user interface, a vocal user interface, a keyboard, a mouse or a similar device, a input port of command strings which has been generated by a remote device.

The probe S1 and/or other possible probes S2, S3, S4, S5, S6 are connected to the input of a processing unit 203 for determining characteristic parameters of the magnetic noise field outside the cavity V of the Magnetic Resonance imaging apparatus and this characteristic data is fed to a compensation coils controller 207.

According to an embodiment, the compensation coils controller 207 is provided with a processor unit configured to calculate from theoretical or empiric functions the characteristic parameters of the magnetic noise field inside the cavity from the characteristic parameters of the noise field outside the cavity. The processor unit of the compensation coils controller is also configured to determine the magnetic noise compensation field to be generated inside the cavity for neutralizing the magnetic noise field inside said cavity. This magnetic noise compensation field is determined as a function of the characteristic parameters describing the magnetic noise field inside said cavity which has been determined from the measured characteristic parameters of the magnetic noise field outside the cavity.

The compensation coil controller 207 controls a compensation field generator 208 which provides the driving power signals for feeding the compensation coils 212.

According to an embodiment the control electronics of the MRI apparatus can be entirely or at least in part in the in the form of software units, consisting of programs for controlling programmable hardware of the Magnetic Resonance imaging apparatus, such as a PC or a central processing and control unit. Optionally the control electronics of the MRI apparatus can be entirely or in part dedicated hardware in which the functional logic is incorporated in the hardware.

The compensation coils 212, already resident in the Magnetic Resonance imaging apparatus, are adapted to compensate for substantially uniform and homogeneous static field fluctuations, induced by outside magnetic fields, in the imaging cavity V. Nevertheless, some fluctuations may show some spatial variability within the cavity, i.e., spatial non homogeneities.

In this case, by suitably controlling gradient coils 214, compensation fields may be also generated for these field fluctuations, induced by noise fields, which have non-uniformities and non-homogeneities in space.

OBJECTS AND SUMMARY

An object of the present invention consists in providing a method and a system for compensating magnetic noise fields in a spatial volume which compensate the magnetic noise fields in a more precise way.

A further object of the present invention is to provide a method and a system for compensating magnetic noise fields in a spatial volume, which allows to effectively manage the contemporaneity of on one hand rapid disturbances and on the other hand periodic disturbances (16, 66, 50 to 60 Hz).

Still a further object of the present invention is to provide a method and a system for compensating magnetic noise fields in a spatial volume, which, in the case of periodic interferences, allows to effectively manage the amplitude modulations of periodic interferences.

Another object of the present invention is to provide a method and a system for compensating magnetic noise fields in a spatial volume, which, allows to manage magnetic noise fields which are higher than 10 mGpp.

An embodiment the present invention relates of a method for compensating for magnetic noise fields in a spatial volume, comprising the following steps:

measuring the strength or other characteristic parameters describing a magnetic noise field outside said spatial volume at least at one location in the surrounding of said spatial volume;

determining by means of the measured characteristic parameters describing the magnetic noise field a compensation magnetic field to be generated outside the spatial volume and which permeates the space outside the spatial volume;

determining, by means of the measured characteristic parameters describing the magnetic noise field a compensation magnetic field which permeates only the space inside the spatial volume.

According to an embodiment the step of determining the compensation magnetic field which permeates only the space inside the spatial volume is carried out by calculating on a theoretical basis, i.e. according to the laws of electromagnetism, or on an empirical basis, the correlation between the noise field outside the spatial volume and the corresponding noise field inside said spatial volume, or calculating the noise field inside the spatial volume, from the measurement/s of the magnetic field outside the spatial volume;

from the inside magnetic noise field, as determined theoretically or empirically, generating a magnetic compensation field, particularly for neutralizing the noise field in said spatial volume, said compensation magnetic field permeates the spatial volume.

According to a further embodiment, the present invention relates to a method for compensating for magnetic noise fields in a spatial volume, comprising the following steps:

providing an electromagnetically shielded environment in which the spatial volume is contained;

measuring the strength and optionally also other characteristic parameters describing a magnetic noise field, at least at one location, inside said electromagnetically shielded environment and outside said spatial volume;

determining by means of said measured characteristic parameters describing the magnetic noise field inside the electromagnetically shielded environment, a compensation magnetic field for said magnetic noise field outside said spatial volume and inside said electromagnetically shielded environment;

determining, by means of said measured characteristic parameters describing the magnetic noise field inside the electromagnetically shielded environment and outside the spatial volume, a magnetic compensation field, particularly for neutralizing the noise field in said spatial volume, said compensation magnetic field permeates the spatial volume;

generating a first magnetic noise compensation field corresponding to said calculated compensation magnetic field of the magnetic noise field outside said spatial volume and inside said electromagnetically shielded environment and permeating the electromagnetically shielded environment with said first magnetic noise compensation field;

generating a second magnetic noise compensation field corresponding to the calculated compensation field of the magnetic noise field inside the spatial volume and permeating with said second compensation field said spatial volume.

According to an embodiment, the step of determining the magnetic noise field inside said spatial volume consists in calculating on a theoretical/analytical basis, i.e. according to the laws of electromagnetism, or on an empirical basis, the correlation between the noise field outside the spatial volume and the corresponding noise field inside said spatial volume, or calculating the noise field inside the spatial volume, from the measurement/s of the magnetic field outside the spatial volume, and from the magnetic noise field inside the spatial volume, as determined theoretically or empirically, a magnetic compensation field, particularly for neutralizing the noise field in said spatial volume is generated, said compensation magnetic field permeates the spatial volume.

According to an embodiment of the present invention which can be provided in combination with the above described embodiments, the first magnetic noise compensation field is determined for reducing or compensating the high amplitude components of the magnetic noise field, and particularly inside the electromagnetically shielded environment.

According to the above described embodiments of the present method two concurrently operating compensation loops comprising:

a closed compensation loop of the magnetic noise fields outside the spatial volume and inside the electromagnetically environment;

an open compensation loop of the magnetic noise fields in the spatial volume;

said two compensation loops generating each one a magnetic noise compensation field;

said two compensation fields concurrently provide for compensation of the magnetic noise field in the spatial volume.

The two loops may be operated at the same time, concurrently or one after the other.

According to the first variant embodiment, the measured parameters of the noise field are used for determining the magnetic compensation fields outside the spatial volume and inside the spatial volume and the first and second magnetic field generators, respectively configured for generating the compensation field outside the spatial volume and only inside the spatial volume are drive at the same time with driving signals which has been determined for generating the corresponding magnetic compensation field.

According to the second variant, the method may be carried out as a two stage or phase process in which:

a first phase comprises the steps of measuring the strength or other characteristic parameters describing a magnetic noise field outside said spatial volume at least at one location in the surrounding of said spatial volume;

determining by means of the measured characteristic parameters describing the magnetic noise field a compensation magnetic field to be generated outside the spatial volume and which permeates the space outside the spatial volume;

and generating said compensation magnetic field permeating the space outside the space volume;

and a second phase or stage comprises the steps of measuring again the strength or other characteristic parameters describing a magnetic noise field outside said spatial volume at least at one location in the surrounding of said spatial volume;

determining the characteristic parameters of the magnetic noise field inside the spatial volume by means of the characteristic parameters describing the magnetic noise field measured outside the spatial volume;

determining by means of the characteristic parameters of the magnetic noise field inside the spatial volume obtained according to the previous step a compensation magnetic field to be generated and permeating only the space of the spatial volume;

and generating the said compensation field permeating only the space of the spatial volume concurrently with said magnetic compensation field permeating the space outside the spatial volume.

The method steps according to any variant embodiment disclosed above and in the following may be cyclically repeated in a continuous way or at certain time intervals.

According to an embodiment, the spatial volume is the imaging cavity enclosed by a magnetic structure of an MRI apparatus.

According to an embodiment, a method for compensating for magnetic noise fields in spatial volumes is provided in which said spatial volume is the imaging cavity of an MRI apparatus for accommodating the patient body or a part thereof in a room wherein said apparatus is housed, said apparatus comprising a magnetic structure partially enclosing said cavity and generating the magnetic fields permeating said cavity, the method comprising the following steps:

measuring the strength and optionally also other characteristic parameters describing a magnetic noise field inside said room and outside said cavity at least at one location;

determining by means of said measured characteristic parameters describing a magnetic noise field inside the room a compensation magnetic field of said magnetic noise field outside said cavity and inside said room;

determining, by means of said measured characteristic parameters describing a magnetic noise field inside the electromagnetically shielded environment and outside the cavity a magnetic compensation field, particularly for neutralizing the noise field in said cavity, said compensation magnetic field permeates the cavity;

generating a first magnetic noise compensation field corresponding to said calculated compensation magnetic field of the magnetic noise field outside said cavity and inside said room and permeating the room with said first magnetic noise compensation field;

generating a second magnetic noise compensation field corresponding to the calculated compensation field of the magnetic noise field inside the cavity and permeating with said second compensation field said cavity in addition to the static magnetic field of the MRI apparatus generated by the magnetic structure of said MRI apparatus.

According to an embodiment, the step of determining, by means of said measured characteristic parameters describing a magnetic noise field inside the electromagnetically shielded environment and outside the cavity a magnetic compensation field, particularly for neutralizing the noise field in said cavity, said compensation magnetic field permeates the cavity comprises the steps of:

on a theoretical/analytical basis, i.e. according to the laws of electromagnetism, or on an empirical basis, determining the correlation between the noise field outside the cavity and the corresponding noise field inside said cavity, or calculating the noise field inside the cavity, from the measurement/s of the magnetic field outside the cavity and from the magnetic noise field inside the cavity, as determined theoretically or empirically, generating a magnetic compensation field, particularly for neutralizing the noise field in said cavity, said compensation magnetic field permeates the cavity.

According to a further embodiment the room is an electromagnetically shielded room for housing the MRI apparatus.

According to a further embodiment the methods according to the different embodiments described above may be provided with steps providing for separate detection of noise fields with frequencies in the range of at least two different frequency bands, or in three or more different frequency bands, and the determination and/or generation of the corresponding compensation field for all, or at least some of the noise fields with frequencies in the range of said at least two, three or more predetermined frequency bands, wherein said compensation field is different for at least some of the noise fields of said at least two frequency bands in the spatial volume and or in the environment in which the spatial volume is located.

The invention relates also to a Magnetic Resonance imaging apparatus comprising a cavity for accommodating a body under examination or a part thereof, wherein the apparatus is integrated with a device for compensating for unwanted noise fields in said cavity, wherein the device includes:

a magnetic field measuring unit for determining characteristic data describing a magnetic noise field outside said cavity;

a closed loop magnetic noise field compensator comprising:

a first magnetic compensation field generator placed outside said MRI apparatus and generating a magnetic noise compensation field permeating the environment in which said MRI apparatus is located;

a magnetic field compensator controller processing the characteristic data describing the magnetic noise field outside said cavity for providing driving signals of the first magnetic compensation field generator causing the generation of a magnetic compensation field for neutralizing the measured magnetic noise field outside said cavity;

the device for compensating for unwanted noise fields, further comprising an open loop magnetic noise field compensator comprising:

a second magnetic compensation field generator integrated in the MRI apparatus and generating a magnetic noise compensation field permeating only the cavity of said MRI apparatus;

a magnetic field compensator controller processing the characteristic data describing the magnetic noise field outside said cavity for providing driving signals of the magnetic compensation field generator causing the generation of a magnetic compensation field of the measured magnetic noise field inside said cavity for neutralizing the magnetic noise field inside said cavity.

According to an embodiment said magnetic field compensator controller comprises a processing unit which processes the characteristic data describing the magnetic noise field outside said cavity by calculating on a theoretical basis or on an empirical basis, a correlation between the characteristic data of the magnetic noise field measured outside the cavity and a corresponding magnetic noise field inside said cavity, or by calculating the characteristic data describing the noise field inside the cavity from the measurements of the characteristic data of the magnetic noise field outside the cavity, and determines the driving signals of the magnetic compensation field generator causing the generation of a magnetic compensation field of the measured magnetic noise field inside said cavity, from the calculated characteristic data of magnetic noise field inside said cavity.

According to an embodiment, the MRI apparatus is provided in combination with a room in which it is located said room, the magnetic field measuring unit for determining characteristic data describing a magnetic noise field being placed inside said room and measuring the magnetic noise field inside said room and outside said cavity;

a closed loop magnetic noise field compensator comprising:

a first magnetic compensation field generator placed outside said MRI apparatus and generating a magnetic noise compensation field permeating the volume delimited by said room in which said MRI apparatus is located;

a magnetic field compensator controller processing the characteristic data describing the magnetic noise field outside said cavity for providing driving signals of the first magnetic compensation field generator causing the generation of a magnetic compensation field for neutralizing the measured magnetic noise field inside said room and outside said cavity;

the device for compensating for unwanted noise fields, further comprising an open loop magnetic noise field compensator comprising:

a second magnetic compensation field generator integrated in the MRI apparatus and generating a magnetic noise compensation field permeating only the cavity of said MRI apparatus;

a magnetic field compensator controller processing the characteristic data describing the magnetic noise field inside said room and outside said cavity for providing driving signals of the magnetic compensation field generator causing the generation of a magnetic compensation field of the measured magnetic noise field inside said cavity for neutralizing the magnetic noise field inside said cavity.

According to an embodiment the magnetic field compensator controller of the open loop compensator comprises processors which processes the characteristic data describing the magnetic noise field inside said room and outside said cavity by calculating on a theoretical basis or on an empirical basis, a correlation between the characteristic data of the magnetic noise field measured inside said room and outside the cavity and a corresponding magnetic noise field inside said cavity, or by calculating the characteristic data describing the noise field inside the cavity from the measurements of the characteristic data of the magnetic noise field inside said room and outside the cavity, and determines the driving signals of the magnetic compensation field generator causing the generation of a magnetic compensation field of the measured magnetic noise field inside said cavity, from the calculated characteristic data of magnetic noise field inside said cavity.

According to an embodiment the room for housing the MRI apparatus is electromagnetically shielded.

According to an embodiment the room for housing the MRI apparatus is a Faraday cage.

According to an embodiment the first magnetic compensation field generator placed outside said MRI apparatus and generating a magnetic noise compensation field permeating the volume delimited by said room in which said MRI apparatus is located is a Helmholtz coil placed or in said room.

According to an embodiment the room is a Faraday cage having lateral walls a top wall and optionally a floor wall and the Helmholtz coil is placed on the top wall of the Faraday cage.

According to a further embodiment the MRI apparatus is provided in combination with magnetic field measuring units for separately detecting magnetic noise fields outside the spatial volume with frequencies in the range of at least two or more different frequency bands; and magnetic compensation field generators for one or more corresponding compensation fields for each, or at least some of the noise fields inside the spatial volumes with frequencies in the range of said at least two or more predetermined frequency bands.

A method according to this further embodiment and a system is described with more details in the published document EP1353192.

The invention relates also to a magnetic noise field compensation system for compensating magnetic noise fields in a spatial volume which is at least partially delimited by walls, said compensation system comprising:

a magnetic field measuring unit for determining characteristic data describing a magnetic noise field in the environment in which said spatial volume is located;

a closed loop magnetic noise field compensator comprising:

a first magnetic compensation field generator and generating a magnetic noise compensation field permeating the environment in which said spatial volume is located;

a magnetic field compensator controller processing the characteristic data describing the magnetic noise field outside said spatial volume for providing driving signals of the first magnetic compensation field generator causing the generation of a magnetic compensation field for neutralizing the measured magnetic noise field in said environment outside said spatial volume;

the device for compensating for unwanted noise fields, further comprising an open loop magnetic noise field compensator comprising:

a second magnetic compensation field generator generating a magnetic noise compensation field permeating only the spatial volume;

a magnetic field compensator controller processing the characteristic data describing the magnetic noise field outside said spatial volume for providing driving signals of the magnetic compensation field generator causing the generation of a magnetic compensation field of the measured magnetic noise field inside said spatial volume for neutralizing the magnetic noise field inside said spatial volume.

According to an embodiment said magnetic field compensation controller processes the characteristic data describing the magnetic noise field outside said spatial volume by calculating on a theoretical basis or on an empirical basis, a correlation between the characteristic data of the magnetic noise field measured outside the spatial volume and a corresponding magnetic noise field inside said spatial volume, or by calculating the characteristic data describing the noise field inside the spatial volume from the measurements of the characteristic data of the magnetic noise field outside the spatial volume, and determines the driving signals of the magnetic compensation field generator causing the generation of a magnetic compensation field of the measured magnetic noise field inside said spatial volume, from the calculated characteristic data of magnetic noise field inside said spatial volume.

Further embodiments of the present invention will be disclosed in the following description.

Yet another embodiment of the inventive method and system consists in providing, alternatively to or in combination with the above, an empirical method for determining the functions for correlation between the noise fields outside the spatial volume and the noise fields inside it, hence a more accurate determination of the magnetic compensation fields.

This additional characteristic includes the following steps:

generating a static magnetic field in the spatial volume, which magnetic field has such a strength and homogeneity as to be suitable for Magnetic Resonance imaging;

introducing a phantom in said static magnetic field, whose response to nuclear spin echo excitation is known;

exciting nuclear spin echoes in said phantom;

receiving nuclear spin echoes from said phantom when fields are provided for compensating for the noise fields in the spatial volume;

comparing actually received data with well-known data;

adjusting the parameters of the functions that are used to calculate or correlate noise fields outside the spatial volume and noise fields inside the spatial volume, on the basis of the differences obtained by the above comparison, and in such a manner as to neutralize or minimize said differences.

This additional characteristic allows to further improve the compensation accuracy and to empirically adjust the functions for calculation or correlation between the noise fields outside the spatial volume and the noise fields inside the spatial volume deriving from said noise field outside the spatial volume.

In first approximation, the frequency response of nuclear spin echoes is analysed, and the discrepancy between the detected frequency and the theoretical well-known phantom frequency response is used to adjust the parameters of the correlation or calculation functions, particularly, the gain of compensation field generators.

According to another improvement, the comparison results may be displayed in graphic form on a monitor, graphic means being provided to adjust the displayed representation, which means automatically generate controls for correcting the parameters of the calculation or correlation functions, corresponding to graphic changes.

DETAILED DESCRIPTION

In the following description and in the above introduction, the term "permeating the space outside the spatial volume" is intended to mean permeating the space in which the spatial volume is housed or placed or is a part of the said space, while the term permeating only the space of the spatial volume means that the magnetic field generated is configured in such a way as to be essentially confined to the space of the spatial volume.

Furthermore, the steps of measuring the magnetic noise field nay be carried out with every mean common for the skilled person such as Hall probes, mono axial magnetometers, bi axial and multiaxial magnetometers.

The more generic embodiment of the present method and system may be applied to any kind of spatial volume, for any kind of scope it might be used in which a magnetic noise field has to be compensated. The spatial volume may be a region in space which is defined by an ideal delimitation surface or at least partially by delimitation walls and the environment in which the spatial volume is located can be also a region delimited by ideal surfaces or a room or chamber at least partly delimited by walls.

Figure 1:
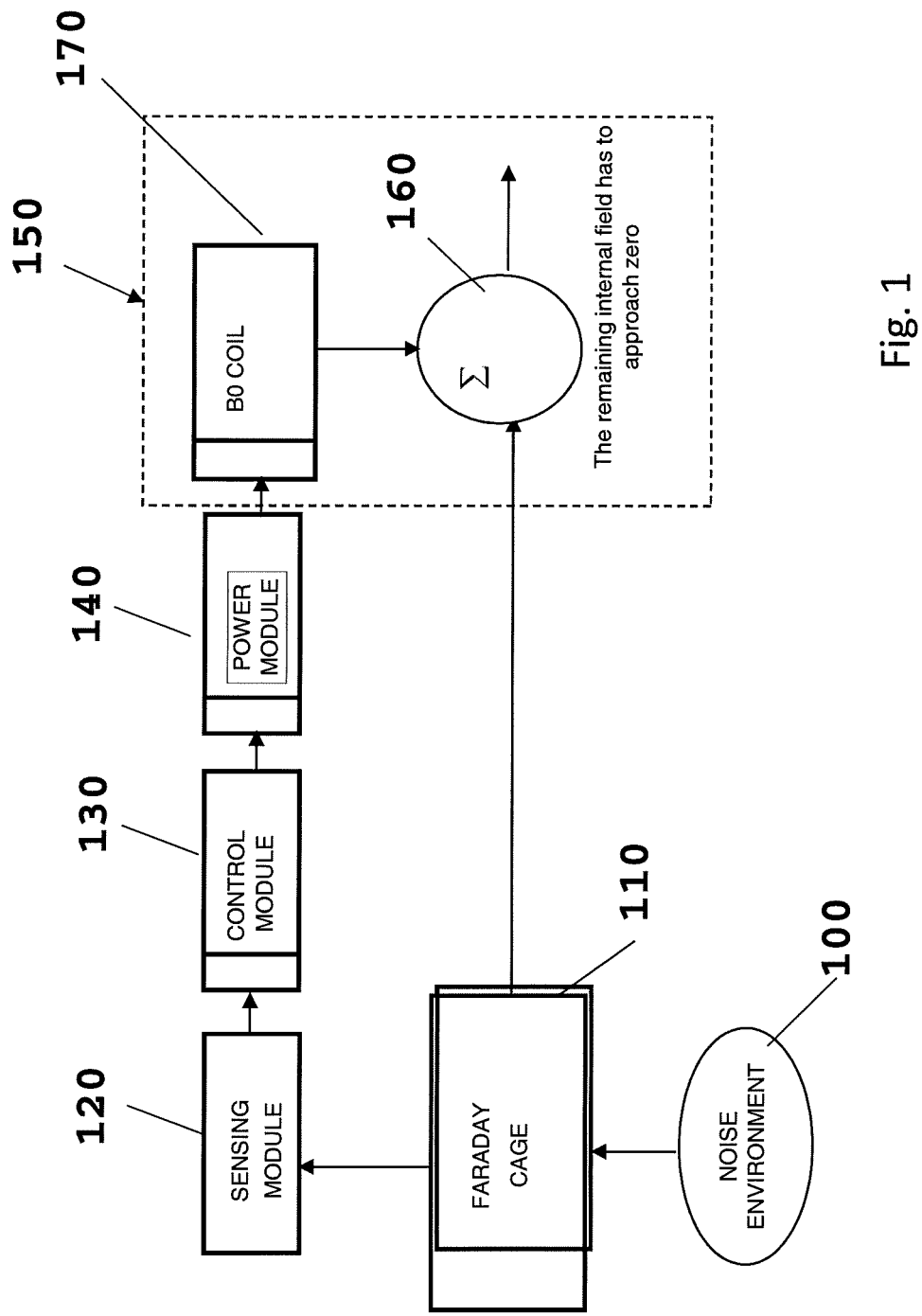
FIG. 1 is a block diagram of an open loop compensator for unwanted noise magnetic fields according to the prior art.
Figure 2:
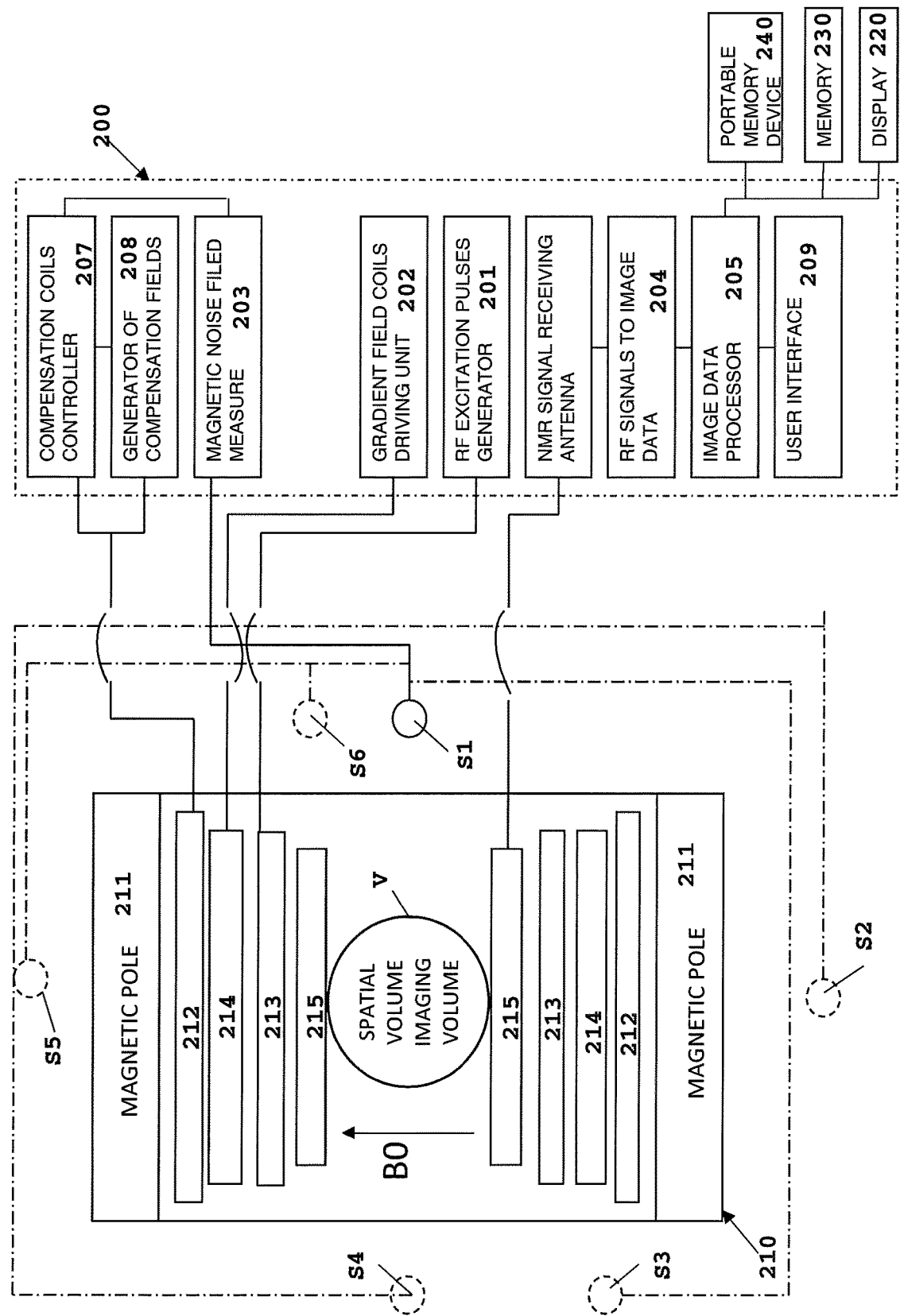
FIG. 2 schematically shows an MRI imaging apparatus comprising an open loop magnetic noise field compensator.
Figure 3:
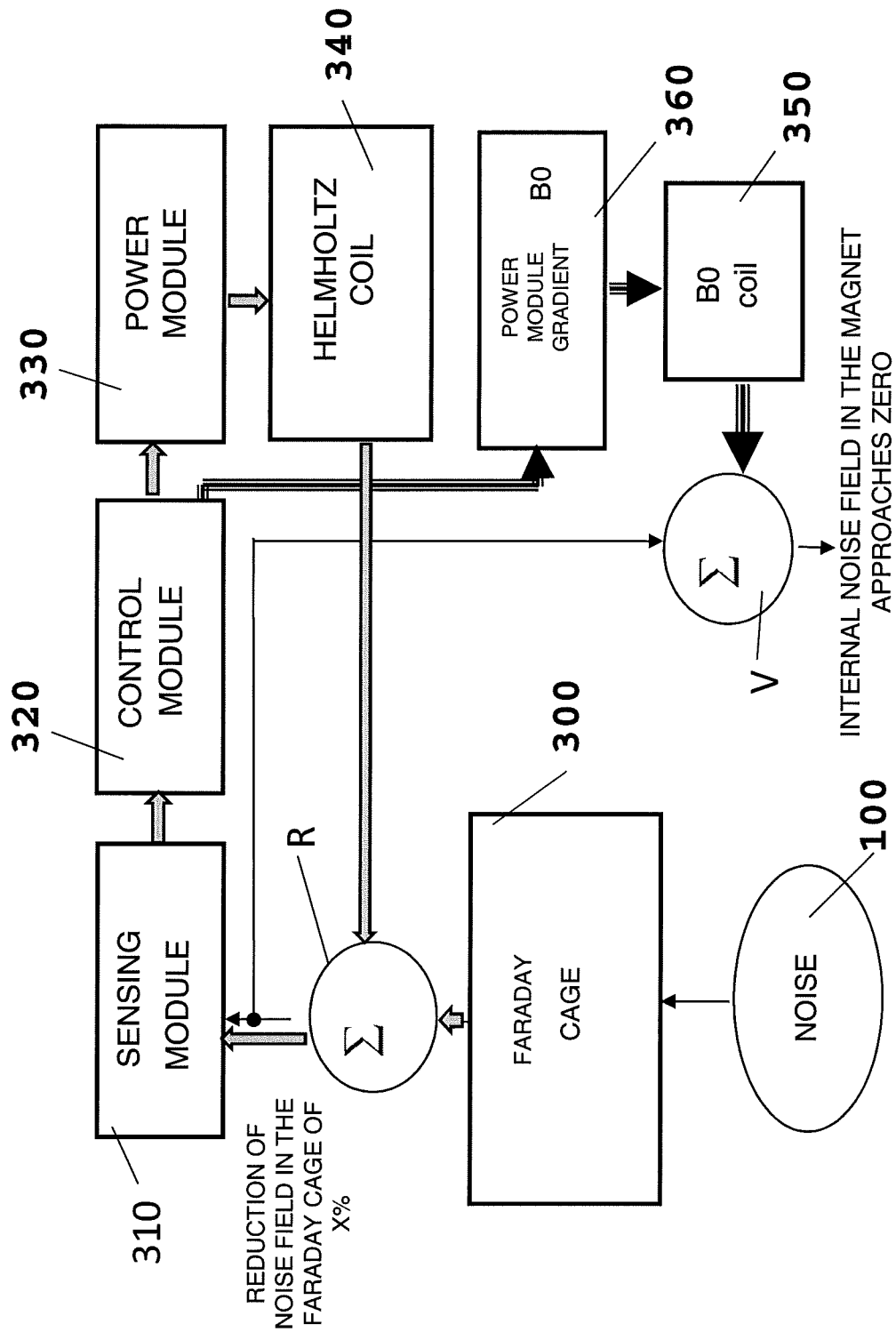
FIG. 3 shows a magnetic noise field compensator according to an embodiment the present invention.

Referring to FIG. 3, an embodiment of a magnetic noise field compensator for compensating unwanted magnetic noise fields inside a spatial volume is shown.

According to this embodiment the magnetic noise field compensator comprises two compensator loops: one closed compensator loop and one open compensator loop.

The embodiment of the magnetic noise field compensator is illustrated in combination with an MRI apparatus comprising a magnet which partially delimits a cavity for entirely or partially housing a body under examination in which the spatial volume is located and which spatial volume may coincide with the imaging volume and is indicated by V The MRI apparatus is housed in an electromagnetically shielded room such as a Faraday cage 300 or similar room which delimits a space R for housing the MRI apparatus.

Magnetic noise fields permeate the electromagnetically shielded room 300 and a sensing module 310 provides for measuring characteristic parameters of the magnetic noise field inside the electromagnetically shielded environment R housing the MRI apparatus, but outside the spatial volume V at least partially delimited by the magnet of the MRI apparatus.

The closed loop compensator comprises said sensing module 310 determining the characteristic parameters of the noise field and a control module 320 which comprises processing means for generating control signals of a power module 330. These control signals are generated as a function of the characteristic parameters of the magnetic noise field and cause the power module 330 to provide power signals to a Helmholtz coil 340 such that a magnetic noise compensation field is generated by said coils 340. This field permeates the electromagnetically shielded environment R and superpose to the magnetic noise field for neutralizing it at least partially.

The closed loop provides at least for a certain reduction of the noise field intensity or strength inside the electromagnetically shielded environment R and is effective on the high amplitude components of the magnetic noise. Applying the compensation field generated by the first closed loop cleans the space R delimited by the Faraday cage 300 where the MRI scanner is placed, thereby helping the internal compensation coils associated to the magnet of the MRI scanner to cancel the noise field inside the spatial volume, or the imaging volume V.

The compensation coils 350 are part of an open loop compensator. According to the present embodiment the open loop compensator shares the sensing module 310 and the control module 320 with the closed loop compensator.

Differently from the closed loop the characteristic parameters of the magnetic noise field which are measured inside the electromagnetically shielded environment R housing the MRI scanner are not directly used for determining the magnetic noise compensation field to be applied to the spatial or imaging volume V only by means of compensation coils 350 associated ad integrated in the magnet structure of the MRI scanner. In the case of the open loop compensator the magnetic noise compensation field is determined as a function of the magnetic noise field inside the spatial or imaging volume V which is determined by analytical calculation or by empirical or numerical estimation as a function of the characteristic parameters of the magnetic noise measured outside the spatial or imaging volume V.

According to this embodiment the control module comprises a processor configured to process the characteristic parameters of the magnetic noise measured outside the spatial or imaging volume V for estimating the characteristic parameters of the magnetic noise field inside the spatial or imaging volume V and for generating from these data control signals for causing the power module 360 to generate power signals driving the internal compensation coil 350 causing the generation of a magnetic noise compensation field permeating the spatial or imaging volume V delimited by the magnet of the MRI scanner. This compensation field adds to the static magnetic field of the MRI apparatus and to the magnetic noise field inside the spatial or imaging volume V and neutralizes said magnetic noise field inside the spatial or imaging volume in a measure to largely suppress the magnetic noise field which approaches zero strength.

As it appears clearly from the above described embodiment, the method according to the present invention comprises essentially a two stage compensation method for suppressing unwanted magnetic noise fields in spatial volumes, particularly in combination with MRI scanners and for suppressing magnetic noise fields in the imaging volume of said MRI scanners, which two stage method comprises a first compensation stage reducing to a certain extent magnetic noise in an environment in which the spatial volume is located and a second compensation stage which refines the compensation of the magnetic noise inside the spatial volume approaching a reduction of the noise fields to zero.

The system for compensating the magnetic noise field when provided in combination with an MRI scanner housed in a Faraday cage, comprises essentially two compensation circuits. The first compensation circuit reduces magnetic noise in the Faraday cage to a certain extent and the second internal compensation circuit refines the compensation of the magnetic noise inside the magnet of the MRI scanner approaching a reduction of the noise fields to zero.

According to an embodiment and differently from the embodiment of FIG. 3, the sensing module 310 and the control module 330 can be separate units for the closed loop compensator and for the open loop compensator.

As it will appear with more details in the following description, several further embodiments are possible.

According to an embodiment the system for compensating unwanted magnetic noise in a spatial volume may have a single probe outside the spatial volume, which is connected to a single processing unit such as a computer unit configured for determining the noise field inside the spatial volume and to a single unit for generating the compensation field.

In accordance with another embodiment, the device may have multiple probes, each dedicated to the detection of noise fields outside the spatial volume in different locations or having a certain direction and or with frequencies in the range of one of a certain number of different frequency bands. A processing unit is configured for calculation or correlation of inside noise fields for each probe and relatively to the different locations of the probes, to different components of the noise field in relation to their spatial direction and or in relation to said predetermined frequency bands. The processing unit of the control module generates driving signals of a power unit for energizing compensation field generator unit or units.

According to an embodiment the compensation field generating unit or units may be destined to generate different compensation fields in relation to different components of the noise field relatively to their spatial direction and or in relation to said predetermined frequency bands.

According to an embodiment said power units include an electronic unit which generates a current to operate one or more magnetic field generating coils, such as solenoids or the like, although a single compensation field generating coil may be provided, which is or may be connected to the different units for generating compensation field exciting currents for the noise fields with frequencies in the range of the at least two, three or more predetermined frequency bands.

According to an embodiment a compensation field generating coil may be provided for each separate unit that generates the compensation field exciting currents, which is associated to one of the at least two, three or more predetermined frequency bands or to a subset of said at least two, three or more frequency bands.

Figure 4:
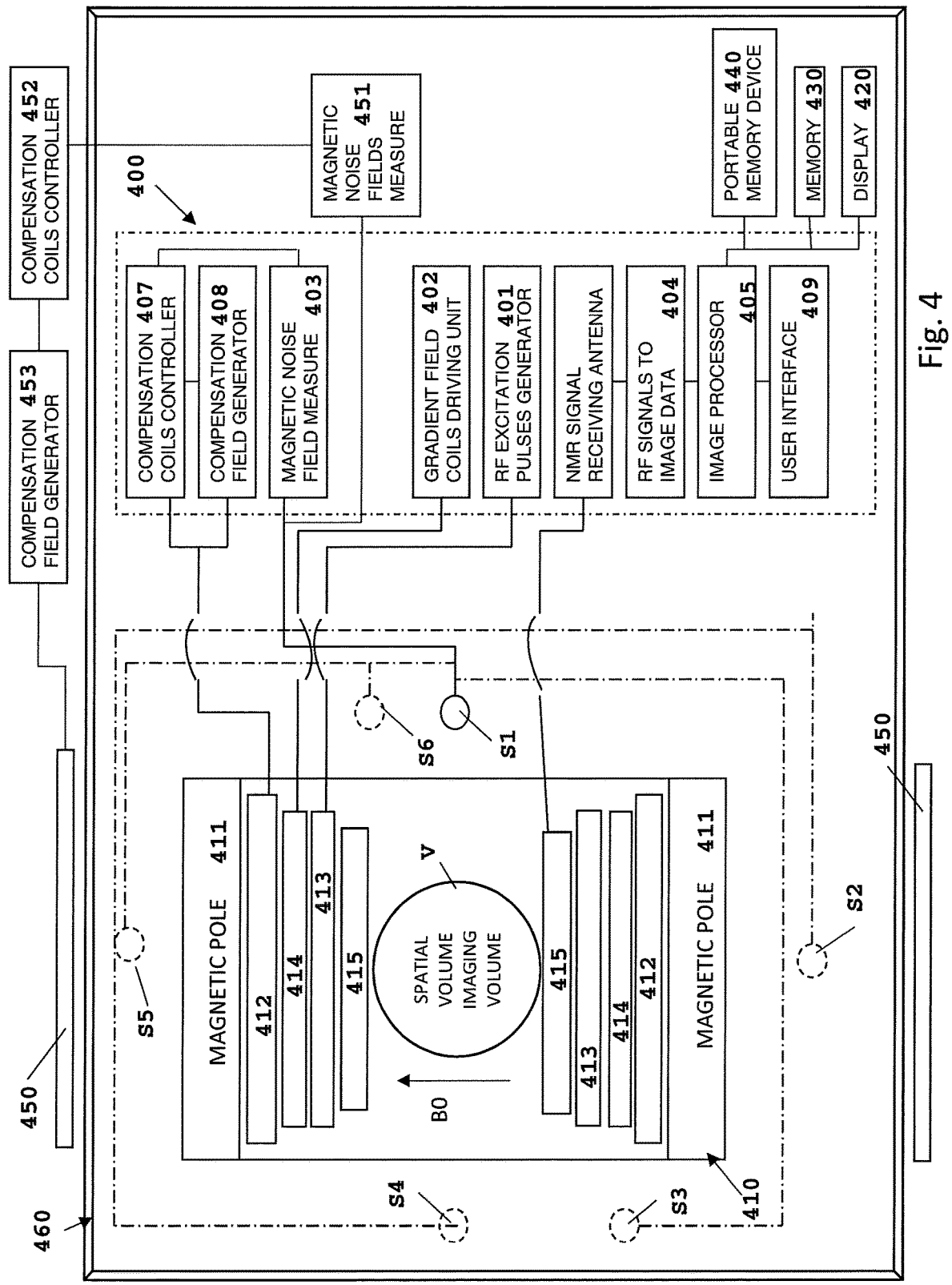
FIG. 4 shows a scheme of an MRI imaging apparatus with a magnetic noise field compensator according to an embodiment the present invention and to FIG. 3.

FIG. 4 shows an embodiment according to the present invention of an MRI apparatus provided in combination with the system for compensating unwanted magnetic noise fields in a spatial volume V which coincides with the entire cavity of the MRI apparatus for housing a body under examination or of a limited portion thereof which coincides with a so called imaging volume V.

FIG. 4 comprises a system for compensating magnetic noise fields having the two compensator loops concurrently providing for magnetic noise compensation outside the cavity or imaging volume V of the MRI apparatus and inside said cavity or imaging volume V by means of two compensation circuits.

FIG. 4 includes a simplified embodiment of a generic MRI apparatus.

The embodiment of FIG. 4 may include at least one probe S1 or multiple probes as shown by the probes S2, S3, S4, S5 and S6, which are shown by dashed and dotted lines.

A dashed line and the numeral 400 denote the control and processing electronics of a Magnetic Resonance imaging apparatus, whereas the blocks included therein are additional functional units, or have functions accomplished by appropriately programmed or controlled units of the Magnetic Resonance imaging apparatus.

Any kind of control electronics may be provided as for example at least in part programmable processing units which are configured or executed software for carrying out specific tasks. Optionally the programmable processing unit can be in the form of a microprocessor or a PC executing software for configuring the processor to carry out specific tasks. Optionally at least one part of the control electronics may be provided as task specific configured hardware which has the functionalities directly implemented in the hardware structure.

The control and processing electronics drives the magnetic structure of the MRI system comprising a magnet 410 for generating a static magnetic field B0 within a cavity at least partially delimited by the magnet and within an imaging volume V in said cavity. The Magnetic Resonance imaging apparatus includes static magnetic field B0 generators, which are denoted with numeral 411.

These static magnetic field generators can be superconductive coils, resistive coils, permanent magnets, or combinations thereof and include within the control electronics 400 specific configured control units for driving said static magnetic field generators.

In the embodiment of the present invention for simplicity the static magnetic field generator comprises two opposite magnetic poles enclosing a cavity for accommodating the body under examination or a part thereof.

Control electronics of the static magnetic field generator is not illustrated in detail since it is part of the common general knowledge of the skilled person.

Furthermore, the magnet structure of the MRI apparatus comprises at least one magnetic noise field compensation coil 412 for generating inside the cavity and the imaging volume V a magnetic noise compensation field which neutralizes at least partially the effect of the magnetic noise fields on the static magnetic field B0.

The system further comprises at least one exciting pulse transmission coil 413 for transmitting to the body under examination one or more sequences of RF pulses for NMR excitation which coil is controlled by a RF excitation pulses generator 401.

The magnet structure comprises magnetic gradient fields generating coils 414 for generating during scanning magnetic field with a predetermined variation along each of three spatial directions (x, y, z) having the function of univocally encoding the nuclear spins and thus allowing to relate the NMR signal contributions of the RF signals received by the RF antenna 415 to a position in space for reconstructing an image. The magnetic gradient fields generating coils 414 are driven by a gradient field coils driving unit 402.

The RF NMR signals are processed by a processing unit 404 converting the RF data into image data and to an image generation unit 405. The reconstructed images can be displayed on a display 420 or stored in memories 430 which can be alternatively or in combination internal memories of the MRI apparatus or memories residing in an external storage servers or in cloud servers. Optionally the images can be store in portable memory devices 440 such as CD rom, DVD rom CD RAM, DVD RAM, memory stics, portable hard disks, or similar devices.

A user interface 409 providing alternatively or in combination different user input devices is provided. The user interface may be alternatively or in combination a graphical user interface, a vocal user interface, a keyboard a mouse or a similar device, a input port of command strings which has been generated by a remote device.

The probe S1 and/or other possible probes S2, S3, S4, S5, S6 are connected to the input of a processing unit 403 for determining characteristic parameters of the magnetic noise field outside the cavity V of the Magnetic Resonance imaging apparatus and this characteristic data is fed to a compensation coils controller 407.

According to an embodiment, the compensation coils controller 407 is provided with a processor unit configured to calculate from theoretical or empiric functions the characteristic parameters of the magnetic noise field inside the cavity from the characteristic parameters of the noise field outside the cavity. The processor unit of the compensation coils controller is also configured to determine the magnetic noise compensation field to be generated inside the cavity for neutralizing the magnetic noise field inside said cavity. This magnetic noise compensation field is determined as a function of the characteristic parameters describing the magnetic noise field inside said cavity which has been determined from the measured characteristic parameters of the magnetic noise field outside the cavity.

The compensation coil controller 407 controls a compensation field generator 408 which provides the driving power signals for feeding the compensation coils 412.

The compensation coils 412, already resident in the Magnetic Resonance imaging apparatus, are adapted to compensate for substantially uniform and homogeneous static field fluctuations, induced by outside magnetic fields, in the imaging cavity V. Nevertheless, some fluctuations may show some spatial variability within the cavity, i.e. spatial non homogeneities.

In this case, by suitably controlling gradient coils 414, compensation fields may be also generated for these field fluctuations, induced by noise fields, which have non-uniformities and non-homogeneities in space.

The magnetic resonance imaging apparatus is housed within a Faraday cage 460 which delimits an electromagnetically shielded environment for the MRI apparatus. At least a compensation field generator coil 450 is provided on the Faraday cage for generating a magnetic noise compensation field permeating the space delimited by said Faraday cage and containing the MRI apparatus. The data sensed by the probes S1 and optionally also by one or more further probes S2 to S6 is fed to the input of a processing unit 451 for determining characteristic parameters of the magnetic noise field outside the cavity V of the Magnetic Resonance imaging apparatus and this characteristic data is fed to a compensation coils controller 452.

The compensation coils controller 452 is provided with a processor unit configured to determine as a function of the characteristic parameters of the measured magnetic noise field inside the faraday cage, the magnetic noise compensation field to be generated for permeating the space delimited by the Faraday cage and outside the cavity. This compensation field is destined to neutralize at least in part the magnetic noise field inside the Faraday cage and outside said cavity or imaging volume V of the MRI apparatus.

The compensation coil controller 452 controls a compensation field generator 453 which provides the driving power signals for feeding the Helmholtz coils 450 provided on the Faraday cage.

A step of the compensation method resides in the correlation functions of the open loop compensator circuit which are used to determine the magnetic noise field inside the cavity or imaging volume V by means of effectively measured data of the magnetic noise field outside said cavity or imaging volume V, in the following different embodiments of methods and systems for carrying out said methods of this step are described which can be provided in combination with the principles of the present inventions and the embodiments described above.

Figure 5:
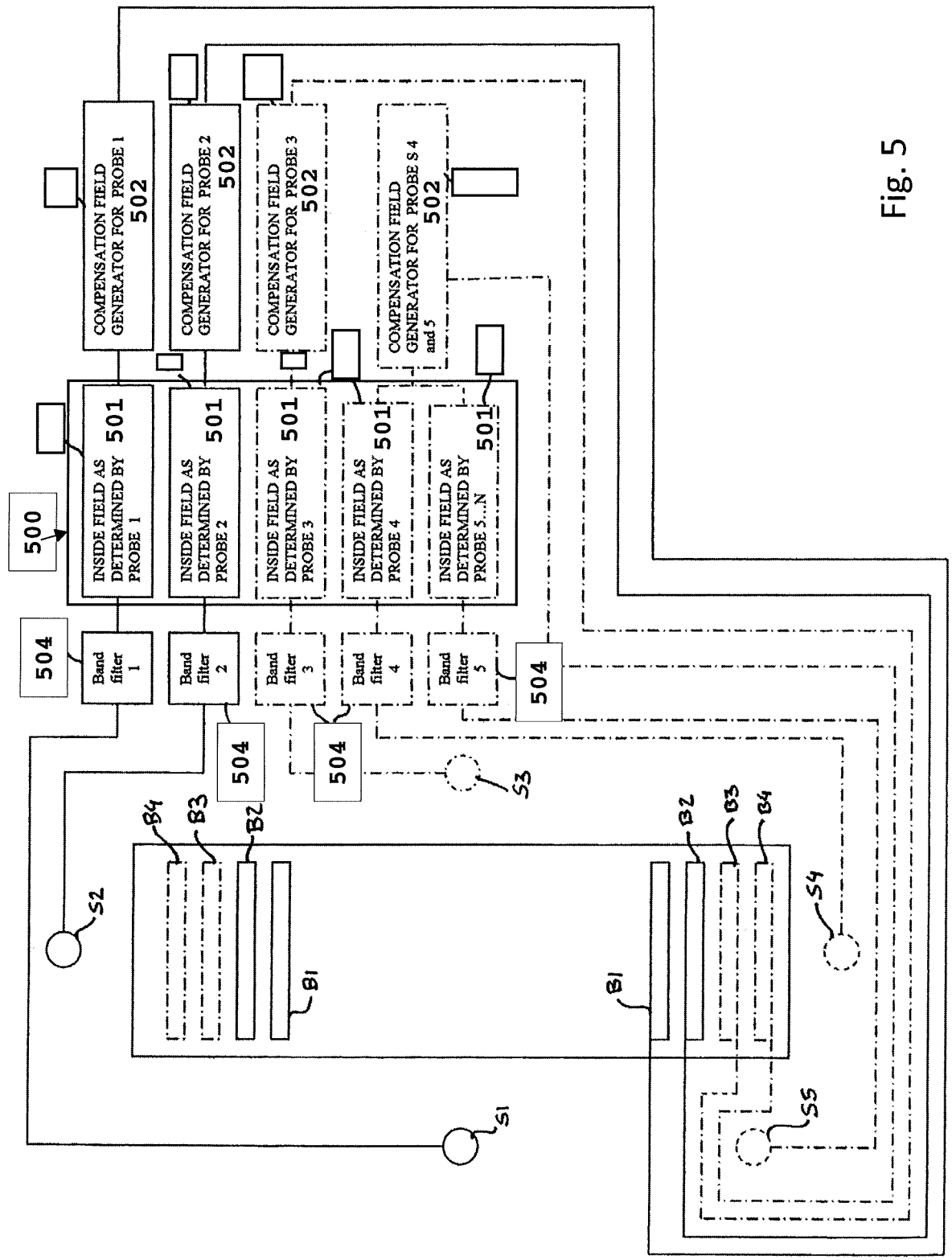
FIG. 5 shows a simplified block diagram of an embodiment of the open loop compensator of an MRI apparatus comprising more than one magnetic noise field sensing or measuring probes and each one for one compensator channel for compensating magnetic noise fields with frequencies within different frequency bands.

In the embodiment of FIG. 5, a system for compensating for magnetic noise fields in a spatial volume V is shown in which the sensing module of the magnetic noise field and the controller and generator of the compensation field are split in different channels each one connected to a separate probe and each channel processing magnetic noise field characteristic parameters related to magnetic noise field with frequencies within different frequency bands. For each frequency band there is provided a different compensation field coil.

Multiple probes for sensing the magnetic noise field and indicated by S1, S2 and optionally S3 to S5 are each one connected to a processing channel of the open loop compensator circuit. Each channel is provided with a frequency band filter 504 for detecting and/or discriminating noise fields with different frequencies.

In fact, as mentioned above, magnetic noise may be generated by several different types of sources and, depending on the latter, noise fields may have different frequencies. A first type of noise field is mainly determined by street traffic or the like, which generates noise fields with frequencies of the order of a few Hz. A second type includes magnetic fields generated by sources which use mains Alternating Current, such as railways or tramways, or the like. In this case, noise fields have frequencies of the order of mains frequency. Furthermore, electric sources may exist which use currents with frequencies corresponding to a rational fraction of the mains current, which generate noise fields having frequencies of about 10 to 20 Hz. A practical analysis of noise fields leads in first approximation to two, or possibly three noise field types which have markedly different frequencies, and may be discriminated from each other and processed separately in an optimized manner. Further regarding magnetic field propagation laws, the two or three different types may differ due to the considerable difference between the generation sources associated to the corresponding noise fields.

The output of each pass band filter 504 is connected to a dedicated processor unit 501 of the compensation field controller 500 and the output of each of said dedicated processor units 501 is connected to a dedicated compensation field driving signal generator 502. Each of the generators 502 feed a different compensation coil B1 to B4 provided inside the magnet of the MRI apparatus 510. Thus for each magnetic noise having a frequency falling within a different frequency band a separated open loop compensation circuit is provided for generating a compensation field for each frequency band.

According to an embodiment, instead of multiple channels the compensation field controller may be include only one channel which is connected alternatively to each probe S1 to S5 by means of a multiplexer, thereby providing a separate alternate processing of the magnetic noise having frequencies within different frequency bands.

The embodiment of FIG. 5 also shows that different subsets of compensation field calculating and generating channels may be combined, and that the currents which generate the compensation fields for these channel subsets (see the channels of frequency bands 4 and 5) are supplied to a common magnetic field generator coil, as shown by the coil B4.

According to an embodiment programmable filters, programmable processing units and/or programmable driving current generator units may be provided which are configured alternatively for processing magnetic noise fields with frequencies falling within different frequency bands avoiding to provide special hardware units, each dedicated to a frequency band.

Although the embodiment described according to FIG. 5 is limited to the open loop compensator circuit, the same principles may apply at the same time or alternatively, mutatis mutandis also to the closed loop compensator circuit.

Figure 6:
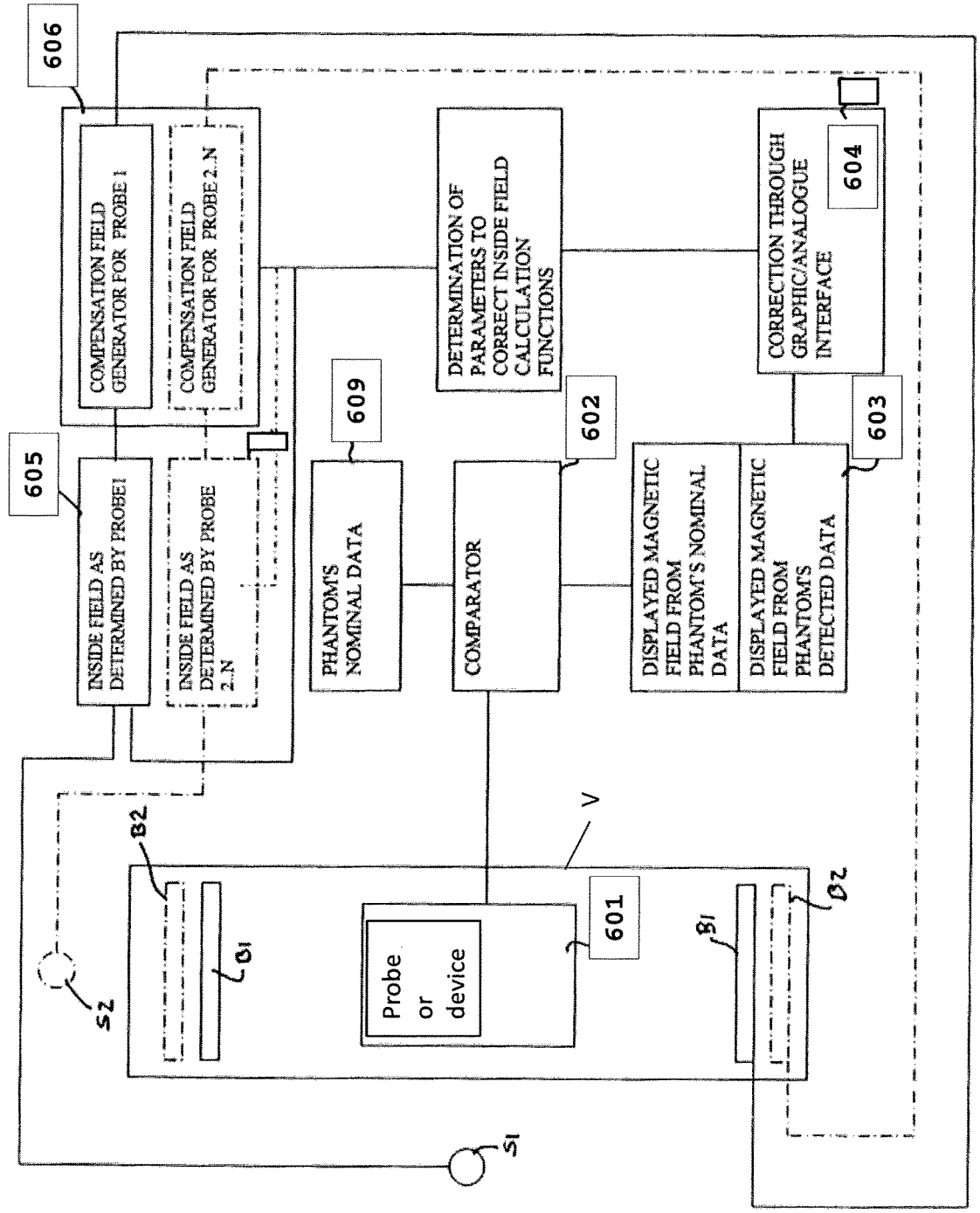
FIG. 6 shows a simplified block diagram of an embodiment of the open loop compensator of an MRI apparatus comprising an active probe for measuring the noise field inside the spatial volume.

According to an embodiment illustrated in FIG. 6, a probe or a device 601 for detecting the magnetic field inside a spatial volume V is provided inside said spatial volume V. The detecting probe or device 601 is connected at its output to a comparator 602, which is in turn connected with display means 603. Data input means 604 are further provided, which may be alphanumeric keyboard means and/or graphic means for graphically adjusting the displayed data.

According to a first operating mode, the detecting probe or device 601 inside the spatial volume V measure the actual noise field, and the data of the characteristic parameters describing the noise field are compared with the data of the characteristic parameters describing said noise field, but resulting from the calculation, based on the characteristic parameters which has been measured for the noise field outside the spatial volume by the probe/s S1 and/or S2.

The comparator 602 compares the data of the characteristic parameters obtained by calculation and by direct measurement inside the spatial volume V. The comparison may be carried out by graphically displaying the two curves representing the magnetic noise according to the two sets of data. The printing on display may be, in overlapped and/or tiled and/or alternate positions of the two curves. Optionally the comparator output is displayed. In this case, the display means and the comparator allow to highlight the differences between the calculated inside noise field, and the actual noise field measured by the active probe 601 inside the spatial volume. This comparison step allows for automatically adjusting the parameters of the function/s for calculating the noise field inside the spatial volume as a function of the noise field outside the spatial volume.

Indeed, an automatic procedure could consist in modifying the set of parameters of the function in such a way that the differences between the measured data and the calculated data are minimized. The setoff parameters obtained by this minimization process is then used as a correct description of the noise field to be compensated. The skilled person has at his/her disposal many different choices for carrying out such minimization process, as for example minimum square algorithm, predictive algorithms, nonlinear curve approximations, and other well-known and commonly used mathematical tools.

The result of the said minimization process is then the description of the noise field which has to be compensated. These data can then be also automatically processed in order to generate the driving signals of the compensation coils.

Depending on the provision of one or more channels for the different frequency bands said comparing and calculation function optimization steps may be also carried out selectively for noise of different frequencies.

According to an embodiment, the display may provide also a visual representation of the automatic correction progress and alternatively or in combination may allow also manual interventions on the adjustment of the parameters of the function for calculating the noise field inside the spatial volume from measurement data of the noise field outside the spatial volume, for example, by entering alphanumeric data through input means and/or by simply changing the graphic profile of the displayed curve representing the noise field through graphic input means.

In the variant embodiment providing manual adjustment, the system can allow the user to modify the curve on the screen by selecting points of the displayed curve representing the calculated data and shifting the said points towards the curve representing the measured data. Each time such graphic stop is carried out, a new function is determined by setting new parameters. The curve representing the modified function is then displayed. This process can be reiterated since a satisfactory overlapping of the curve representing the measured data and the curve representing the calculated data is obtained. This function is the considered describing the noise field and used for determining the compensation field. According to a variant embodiment, this process can be carried out for more than one point at a time or for one or more segments of the curve.

A unit for correlating graphic controls with the corresponding adjustments to calculation function parameters, generates the controls to be transmitted to current generator/s for correcting the currents generated based on or directly by processing units of the compensation field controller 605, to directly correct the parameters of the calculation functions executed thereby.

According to an embodiment of the apparatus the different units disclosed above can be in the form of a specific circuitry which is dedicated only to the function of measuring and compensating magnetic noise according to the method and systems of the present invention.

In a variant embodiment the circuitry is at least partially formed by generic programmable hardware, such as microprocessors or pc, which is configured to execute a software and in combination with a software providing instructions to the hardware for carrying out the functions of the above disclosed units or at least of part of the said units.

In a further variant embodiment which can apply also for every disclosed embodiment, the circuitry is at least in part formed by the driving, control and processing units which are commonly already provided in an MRI scanner. Typically, these units are processing units capable of carrying out a software providing instructions to the processing hardware for executing specific tasks or functions. In particular, as an example, a MRI scanner comprises commonly at least one or more of the following units: a digital signal processor extracting image data from the RF signals received by the antenna, a image processing unit configured or which can be configured for carrying out different image processing tasks, a driving unit for generating driving signals for magnetic field generating coils, such as for example one or more gradient coils.

Figure 7:
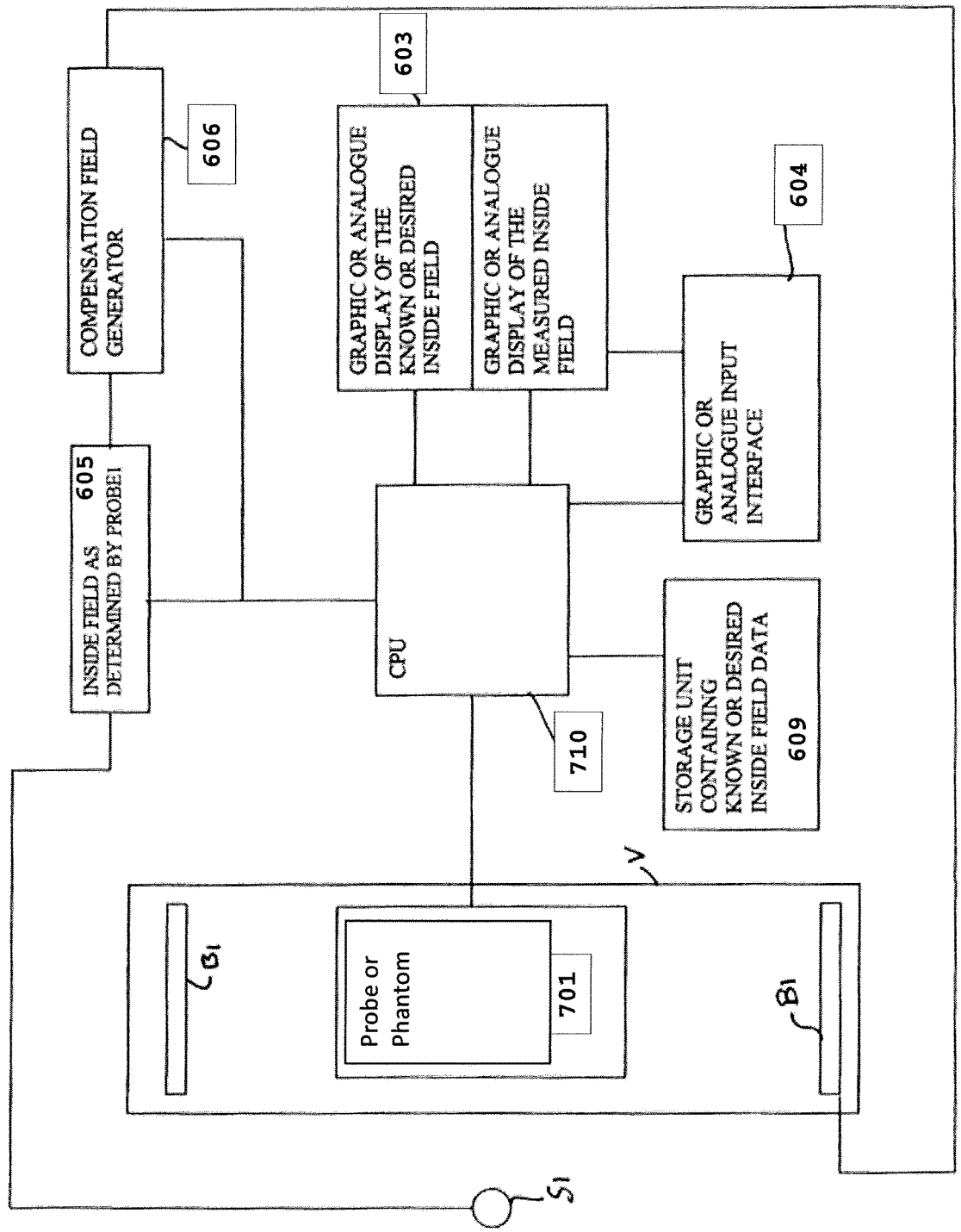
FIG. 7 shows a simplified block diagram of a further embodiment of an open loop compensator in an MRI apparatus comprising means for measuring the noise field inside the spatial volume and automatic or manual means for correcting the inside noise field calculation function and/or the currents for generating compensation fields for these inside noise fields.

In accordance with the example of FIGS. 6 and 7, the field probe used can be a phantom on which the MRI scanning is carried out. The acquired imaged data of the phantom is obtained by a common MRI system. The image of the phantom may be displayed using the common image generation and processing tools of the MRI system.

Also the comparison of the acquired image data of the phantom with the effective one can be carried out by using the common processing units already provided in an MRI scanner which can be configured to carry out the said task by executing a specific software. This software con also provides as an output the control signals for controlling the driving units of the coils to generate the driving signals of the compensation coils corresponding to the noise field being measured by said comparison.

FIG. 7 shows a variant embodiment of the embodiment of FIG. 6, wherein the functions for calculating the noise field characteristic parameters basing on the characteristic parameters of the noise field outside the spatial volume V and the comparison of the characteristic parameters measured by the active probe 701, as well as the optimization process of the parameters of the function for calculating the noise field characteristic parameter inside the spatial volume as a function of the characteristic parameters of the noise field outside the spatial volume are performed by a processing unit, which comprises a microprocessor or a computer, whose central processing unit 710 controls the processing unit 604, the driving current generator means 606, the display means 603 which are configured as peripheral units of said computer 710.

A variant embodiment, which is expressly shown in the Figure, replaces the detection probe inside the spatial volume V with a device for detecting compensation conditions, which operates on the basis of the changes to an active well-known static field, which is disposed inside the spatial volume V.

Here, there is no direct comparison between the inside noise fields determined from the measurements of the corresponding noise fields outside the spatial volume V, but the comparison is performed between the characteristics of the well-known static field as actually measured inside the spatial volume v and theoretically known characteristics.

Any type of device operating with the help of magnetic fields may be used for this purpose. Particularly, a suitable device for this purpose is a nuclear spin resonance echo detection device.

In this case, the device includes a so-called phantom, i.e. a test member having a known response to Magnetic Resonance stress. The MRI scanner is used to excite and receive nuclear spin echoes from the phantom and to compare the data of said echoes with theoretical known data, which is stored in a suitable storage unit, as shown with numeral 609 in FIG. 6.

From a first analysis, a simple comparison may be performed between the frequency of these detected nuclear spin echoes and the theoretically expected frequency thereof.

The curves of the actual static field may be determined from the received echo signals and compared with the theoretical field. As described above, here again, the corrections to calculation function parameters in the processing unit 604 and/or to the currents for generating the compensation field/s may be determined by using either an automatic mode or a manual mode, by inputting alphanumeric data and/or graphic interventions, always with the purpose of minimizing or neutralizing the differences detected by the comparator.

Figure 8:
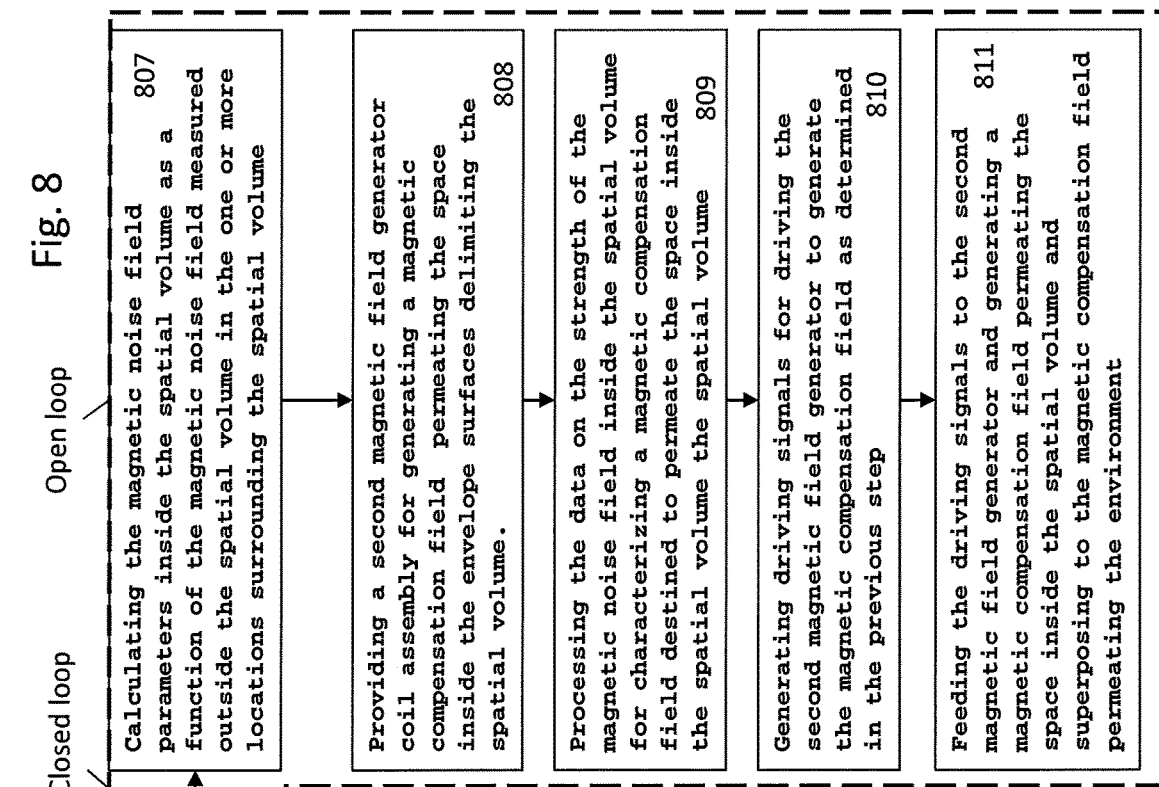
FIG. 8 shows a flow diagram of the method for compensating for magnetic noise fields in its more generic embodiment.

FIG. 8 shows a flow diagram of the operation for a generic system for compensating magnetic noise fields in a spatial volume.

The compensation system may be used for compensation for magnetic noise fields in any spatial volume located in any kind of environment.

The spatial volume may be a region of an environment which is delimited by ideal surfaces from the rest of the space of the environment surrounding it. The spatial volume may be at least partially delimited from the surrounding environment by one or more walls.

The environment itself can be unlimited or at least partially defined by ideal surfaces or a delimited space being at least partially limited from the surrounding space by one or more walls.

In FIG. 8 the two loops, open and closed are clearly identified. The main generic feature of the closed loop is provided by the fact that the one or more probes for measuring the characteristic parameters of the noise field are located in the environment outside the spatial volume which is also permeated by the magnetic compensation field generated by the first magnetic field generators. Thus the compensation field has a direct influence on the measured parameters by the one or more probes.

The open loop is indicated by non-continuous lines enclosing the steps executed by the open loop and differently from the closed loop the one or more probes for measuring the magnetic noise field are outside the spatial volume or if probes are provided inside the spatial volume the characteristic parameters of the noise field are not directly measured in real time but are determined by calculation. One example of this is disclosed for the embodiments of FIG. 6 or 7.

The previous preparation step is to define the limits of the spatial volume as indicated in step 801.

The measured data, which in the embodiment shown at step 802 are mainly the strength of the magnetic noise field outside the spatial volume and in the environment surrounding said spatial volume are then processed at step 804 in order to determine the strength and/or other additional characteristic parameters of a magnetic field which compensates for the measured noise field. Form these data, at step 805 driving signals of a magnetic compensation field generator are generated. Using a resistive or superconductive coli assembly as magnetic field generator, the driving signals are electric signals which are configured in such a way to drive the coil assembly for generating the magnetic compensation field when fed at step 806 to a first magnetic field generator coil assembly provided at step 803.

The said first magnetic field generator coil assembly is configured in such a way to generate a field which permeates the environment in which the spatial volume is located. By defining a coil assembly it is common practice to calculate the magnetic field lines of the magnetic field generated by the coil assembly and so it is possible to place the coil assembly relatively to the environment in such a way that the environment is permeated by the said filed lines.

The measures of the magnetic noise field characteristic parameters carried out at step 802 are used at steps 807 for calculating the magnetic noise field parameters inside the spatial volume as a function of the magnetic noise field measured outside the spatial volume in the one or more locations surrounding the spatial volume.

At step 809 the data obtained for the magnetic noise field inside the spatial volume are processed for determining the characterizing parameters of a magnetic compensation field destined to permeate the space inside the spatial volume and at step 810 driving signals are generated for driving a second magnetic field generator to generate a magnetic compensation field according to the step 809. At step 811 this driving signals are fed to the said second magnetic field generator.

This second magnetic compensation field is configured in such a way that it permeates only the spatila volume and adds inside this spatial volume to the magnetic compensation field permeating the environment in which the spatial volume is located.

The steps 812 to 811 may be continuously repeated or the repetition may be carried out at certain time intervals.

The step 802 of measuring the strength or other characteristic parameters such as the direction of the magnetic noise field may be carried out only once before carrying out the steps 803 to 806 so that the same measurement results are used of carrying out the steps 807 to 811, or the said measurement step 802 is repeated after having carried out step 806 so that the compensation steps 802 to 96 and 802, 807 to 811 are carried out one after the other.

Figure 9:
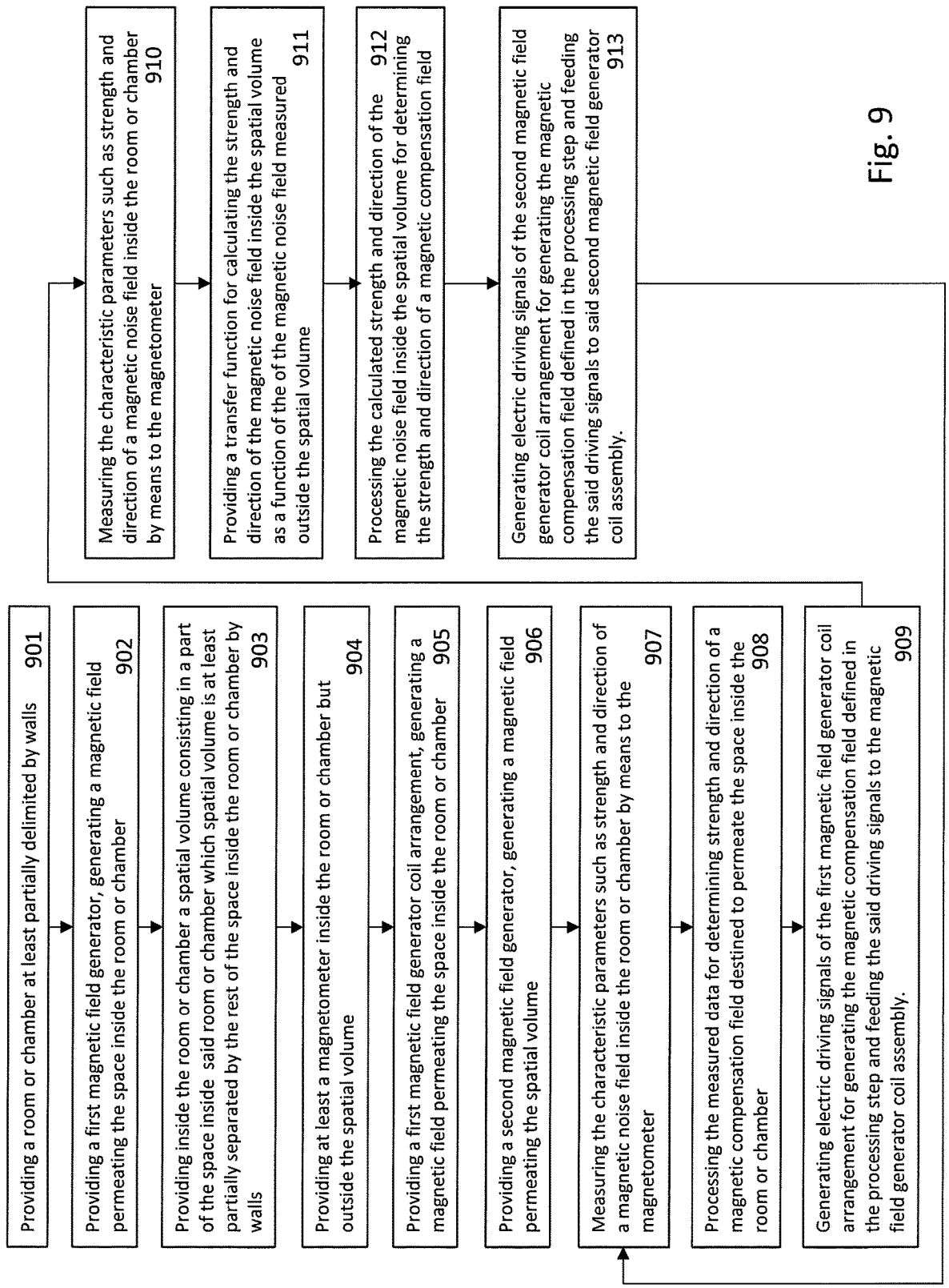
FIG. 9 shows a flow diagram of a two phase compensation system in which the closed and open loop compensation steps are carried out one after the other.

This second option is described in the flow diagram of FIG. 9.

Although the embodiment of FIG. 9 is directed to a more limited embodiment of the compensation system in which the environment is a room or a chamber having delimiting walls and the spatial volume may be only a region of the space inside the said room or chamber which can be only ideally delimited or at least partially delimited by wall, the embodiment of FIG. 9 may be applied also to the more generic system and method of FIG. 8 by taking the necessary and obvious modifications.

Steps 901 to 906 are steps relating to the definition of the structure and in particular:

At step 901 the room or chamber forming the environment is defined. In the specific embodiment disclosed above according to one or more of the previous FIGS. 1 to 7, the room is, according to a non-limiting example a Faraday cage in which an MRI apparatus is housed.

The first magnetic field generator is provided generating a magnetic field permeating the space inside the room or chamber.

Measuring probes or devices of the magnetic noise field are provided at step 905 in the form of one or more magnetometers in the space inside the room or chamber.

The spatial volume defined at step 903 and located in or being a partial region of the space inside the room or chamber is associated with a second magnetic field generator (step 906) which is configured for generating a magnetic field permeating essentially only the spatial volume.

Steps 907 to 909 corresponds to the steps 802, 804 to 806 of the previous more generic example.

Following the generation of the first compensation field permeating the room or chamber in which the spatial volume is located the step 907 is repeated at 910. These data is used for calculating by means of theoretical and analytical relationships the noise field inside the spatial volume out of the measured data of the noise field taken outside the spatial volume. In step 912 the calculated strength and direction of the magnetic noise field inside the spatial volume is further processed for determining the strength and direction of a magnetic compensation field and in step 913 electric driving signals of the second magnetic field generator coil arrangement for generating the magnetic compensation field defined in the processing step are generated and fed to said second magnetic field generator coil assembly.

At the end of the process two magnetic compensation fields are generated which adds together for compensating the magnetic noise field inside the spatial volume. One field compensating noise field in the environment in which the spatial volume is placed and the other compensation field compensating the remaining noise field inside the spatial volume.

As indicated by the arrow connecting step 913 to step 907, the process can be repeated continuously or also at certain predetermined intervals of time.

The invention claimed is:

1. A method for compensating magnetic noise in a spatial volume in which two concurrently operating compensation loops for the magnetic noise are provided, the two concurrently operating compensation loops include a closed compensation loop for magnetic noise fields outside the spatial volume in an environment in which the spatial volume is located; and an open compensation loop for magnetic noise fields inside the spatial volume;

the method comprising:
each of said two compensation loops generating a respective magnetic noise compensation field; and
said two compensation fields concurrently providing for compensation of the magnetic noise field in the spatial volume by applying the compensation field generated by the closed compensation loop to the environment in which the spatial volume is located and by applying the compensation field generated by the open compensation loop only inside said spatial volume.

2. The method for compensating for magnetic noise fields in a spatial volume, according to claim 1, further comprising the following steps:

measuring a strength or other characteristic parameter describing the magnetic noise fields outside said spatial volume at least at one location surrounding said spatial volume;
determining by the measured characteristic parameter describing the magnetic noise fields a compensation magnetic field to be generated outside the spatial volume and which permeates the space outside the spatial volume; and
determining, by the measured characteristic parameter describing the magnetic noise fields a compensation magnetic field which permeates only the space inside the spatial volume.

3. The method according to claim 2, in which the step of determining the compensation magnetic field which permeates only the space inside the spatial volume is carried out by calculating on a theoretical basis according to the laws of electromagnetism, or on an empirical basis, a correlation between the noise field outside the spatial volume and the corresponding noise field inside said spatial volume, or calculating the noise field inside the spatial volume, from the measurement/s of the magnetic field outside the spatial volume;
from the inside magnetic field, as determined theoretically or empirically, generating a magnetic compensation field, particularly for neutralizing the noise field in said spatial volume, said compensation magnetic field permeates the spatial volume.

4. The method according to claim 1, comprising the following steps:

providing an electromagnetically shielded environment in which the spatial volume is contained;
measuring the strength and optionally also other characteristic parameters describing a magnetic noise field, at least at one location, inside said electromagnetically shielded environment and outside said spatial volume;
determining by said measured characteristic parameters describing the magnetic noise field inside the electromagnetically shielded environment a compensation magnetic field of said magnetic noise field outside said spatial volume and inside said electromagnetically shielded environment;
determining, by means of said measured characteristic parameters describing the magnetic noise field inside the electromagnetically shielded environment and outside the spatial volume, a magnetic compensation field, for neutralizing the noise field in said spatial volume, said compensation magnetic field permeates the spatial volume;

generating a first magnetic noise compensation field corresponding to said calculated compensation magnetic field of the magnetic noise field outside said spatial volume and inside said electromagnetically shielded environment and permeating the electromagnetically shielded environment with said first magnetic noise compensation field; and generating a second magnetic noise compensation field corresponding to the calculated compensation field of the magnetic noise field inside the spatial volume and permeating with said second compensation field said spatial volume.

5. The method according to claim 4, in which the step of determining the magnetic noise field inside said spatial volume comprises:

calculating according to laws of electromagnetism, or on an empirical basis, a correlation between the noise field outside the spatial volume and the corresponding noise field inside said spatial volume, or calculating the noise field inside the spatial volume, from the measurement/s of the magnetic field outside the spatial volume, and from the magnetic noise field inside the spatial volume, as determined theoretically or empirically, a magnetic compensation field, for neutralizing the noise field in said spatial volume is generated, said compensation magnetic field permeates the spatial volume.

6. The method according to claim 1, in which the spatial volume is an imaging cavity enclosed by a magnetic structure of an MRI apparatus.

7. The method according to claim 6, for compensating for magnetic noise fields in spatial volumes in which said spatial volume is the imaging cavity of an MRI apparatus for accommodating a patient body or a part thereof in a room wherein said apparatus is housed, said apparatus comprising a magnetic structure partially enclosing said cavity and generating the magnetic fields permeating said cavity, the method further comprising the following steps:

measuring the strength and optionally also other characteristic parameters describing a magnetic noise field inside said room and outside said cavity at least at one location;

determining by said measured characteristic parameters describing a magnetic noise field inside the room a compensation magnetic field of said magnetic noise field outside said cavity and inside said room;

determining, by said measured characteristic parameters describing a magnetic noise field inside the electromagnetically shielded environment and outside the cavity a magnetic compensation field, particularly for neutralizing the noise field in said cavity, said compensation magnetic field permeates the cavity;

generating a first magnetic noise compensation field corresponding to said calculated compensation magnetic field of the magnetic noise field outside said cavity and inside said room and permeating the room with said first magnetic noise compensation field;

generating a second magnetic noise compensation field corresponding to the calculated compensation field of the magnetic noise field inside the cavity and permeating with said second compensation field said cavity in addition to the static magnetic field of the MRI apparatus generated by the magnetic structure of said MRI apparatus.

8. The method according to claim 7, in which the step of determining, by said measured characteristic parameters describing a magnetic noise field inside the electromagnetically shielded environment and outside the cavity a magnetic compensation field, particularly for neutralizing the noise field in said cavity, said compensation magnetic field permeates the cavity comprises the steps of:

on a theoretical/analytical basis or on an empirical basis, determining a correlation between the noise field outside the cavity and the corresponding noise field inside said cavity, or calculating the noise field inside the cavity, from the measurement/s of the magnetic field outside the cavity and from the magnetic noise field inside the cavity, as determined theoretically or empirically, generating a magnetic compensation field, particularly for neutralizing the noise field in said cavity, said compensation magnetic field permeates the cavity.

9. The method according to claim 6, in which the room is an electromagnetically shielded room for housing the MRI apparatus.

10. The method according to claim 1, comprising the steps of separate detection of noise fields with frequencies in the range of at least two different frequency bands, or in three or more different frequency bands, and the determination and/or generation of the corresponding compensation field for all, or at least some of the noise fields with frequencies in the range of said at least two, three or more predetermined frequency bands, wherein said compensation field is different for at least some of the noise fields of said at least two frequency bands in the spatial volume and or in the environment in which the spatial volume is located.

11. A Magnetic Resonance Imaging (MRI) apparatus comprising a cavity for accommodating a body under examination or a part thereof, wherein the apparatus is integrated with a device for compensating for unwanted noise fields in said cavity, wherein the device comprises:

a magnetic field measuring unit for determining characteristic data describing a magnetic noise field outside said cavity;

a closed loop magnetic noise field compensator comprising:

a first magnetic compensation field generator placed outside said MRI apparatus and generating a magnetic noise compensation field permeating the environment in which said MRI apparatus is located;

a magnetic field compensator controller processing the characteristic data describing the magnetic noise field outside said cavity for providing driving signals of the first magnetic compensation field generator causing the generation of a magnetic compensation field for neutralizing the measured magnetic noise field outside said cavity;

the device for compensating for unwanted noise fields, further comprising:

an open loop magnetic noise field compensator comprising:

a second magnetic compensation field generator integrated in the MRI apparatus and generating a magnetic noise compensation field permeating only the cavity of said MRI apparatus; and a magnetic field compensator controller processing the characteristic data describing the magnetic noise field outside said cavity for providing driving signals of the magnetic compensation field generator causing generation of a magnetic compensation field of the measured magnetic noise field inside said cavity for neutralizing the magnetic noise field inside said cavity.

12. The MRI apparatus according to claim 11, in which said magnetic field compensator controller comprises a processing unit which processes the characteristic data describing the magnetic noise field outside said cavity by calculating on a theoretical basis or on an empirical basis, a correlation between the characteristic data of the magnetic noise field measured outside the cavity and a corresponding magnetic noise field inside said cavity, or by calculating the characteristic data describing the noise field inside the cavity from the measurements of the characteristic data of the magnetic noise field outside the cavity, and determines driving signals of the magnetic compensation field generator causing the generation of a magnetic compensation field of the measured magnetic noise field inside said cavity, from calculated characteristic data of magnetic noise field inside said cavity.

13. The MRI apparatus according to claim 11, which is provided in combination with a room in which it is located, the magnetic field measuring unit for determining characteristic data describing a magnetic noise field being placed inside said room and measuring the magnetic noise field inside said room and outside said cavity;

the first magnetic compensation field generator of the closed loop compensator being placed outside said MRI apparatus and generating a magnetic noise compensation field permeating the volume delimited by said room in which said MRI apparatus is located for neutralizing the measured magnetic noise field inside said room and outside said cavity.

14. The MRI apparatus according to claim 13, in which the room for housing the MRI apparatus is electromagnetically shielded.

15. The MRI apparatus according to claim 11, in which the first magnetic compensation field generator placed outside said MRI apparatus and generating a magnetic noise compensation field permeating the volume delimited by said room in which said MRI apparatus is located is a Helmholtz coil placed outside or in said room.

16. The MRI apparatus according to claim 11, wherein the MRI apparatus further comprises:

magnetic field measuring units for separately detecting magnetic noise fields outside the spatial volume with frequencies in the range of at least two or more different frequency bands; and magnetic compensation field generators for one or more corresponding compensation fields for each, or at least some of the noise fields inside the spatial volumes, with frequencies in the range of said at least two or more predetermined frequency bands.

17. A magnetic noise field compensation system for compensating magnetic noise fields in a spatial volume which is at least partially delimited by walls, said compensation system comprising:

a magnetic field measuring unit for determining characteristic data describing a magnetic noise field in the environment in which said spatial volume is located;

a closed loop magnetic noise field compensator comprising:

a first magnetic compensation field generator for generating a magnetic noise compensation field permeating the environment in which said spatial volume is located;

a magnetic field compensator controller processing the characteristic data describing the magnetic noise field outside said spatial volume for providing driving signals of the first magnetic compensation field generator causing the generation of a magnetic compensation field for neutralizing the measured magnetic noise field in said environment outside said spatial volume;

the device for compensating for unwanted noise fields, further comprising:

an open loop magnetic noise field compensator comprising:

a second magnetic compensation field generator generating a magnetic noise compensation field permeating only the spatial volume;

a magnetic field compensator controller processing the characteristic data describing the magnetic noise field outside said spatial volume for providing driving signals of the magnetic compensation field generator causing the generation of a magnetic compensation field of the measured magnetic noise field inside said spatial volume for neutralizing the magnetic noise field inside said spatial volume.

18. The Magnetic noise field compensation system according to claim 17, in which said magnetic field compensation controller processes the characteristic data describing the magnetic noise field outside said spatial volume by calculating on a theoretical basis or on an empirical basis, a correlation between the characteristic data of the magnetic noise field measured outside the spatial volume and a corresponding magnetic noise field inside said spatial volume, or by calculating the characteristic data describing the noise field inside the spatial volume from the measurements of the characteristic data of the magnetic noise field outside the spatial volume, and determines the driving signals of the magnetic compensation field generator causing the generation of a magnetic compensation field of the measured magnetic noise field inside said spatial volume, from the calculated characteristic data of magnetic noise field inside said spatial volume.

19. The method for compensating for magnetic noise fields in a spatial volume according to claim 1, further comprising the following steps for determining the magnetic noise field inside the spatial volume:

generating a static magnetic field in the spatial volume, which magnetic field has such a strength and homogeneity as to be suitable for Magnetic Resonance Imaging;

introducing a phantom in said static magnetic field, whose response to nuclear spin echo excitation is known;

exciting nuclear spin echoes in said phantom;

receiving nuclear spin echoes from said phantom when fields are provided for compensating for the noise fields in the spatial volume;

comparing actually received data with well-known data;

adjusting parameters of functions that are used to calculate or correlate noise fields outside the spatial volume and noise fields inside the spatial volume, on the basis of the differences obtained by the above comparison, and in such a manner as to neutralize or minimize said differences.

* * * * *